(12) United States Patent
Zhang

(10) Patent No.: US 6,204,698 B1
(45) Date of Patent: Mar. 20, 2001

(54) ROBUST LOW VOLTAGE SWING SENSE AMPLIFIER

(75) Inventor: Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/351,144

(22) Filed: Jul. 12, 1999

(51) Int. Cl.[7] .................................................. G01R 19/00
(52) U.S. Cl. .............................................. 327/55; 327/57
(58) Field of Search ............................ 326/95, 112, 115; 327/51, 52, 53, 54, 55, 56, 57, 200, 210, 211

(56) References Cited

U.S. PATENT DOCUMENTS

| | | | |
|---|---|---|---|
| 4,247,791 | * | 1/1981 | Rovell ..................................... 327/55 |
| 4,831,287 | * | 5/1989 | Golab ..................................... 327/55 |
| 5,650,971 | * | 7/1997 | Longway et al. ..................... 365/207 |
| 5,726,942 | * | 3/1998 | Yoneda et al. ......................... 327/57 |
| 5,821,792 | * | 10/1998 | Miwa ..................................... 327/57 |

OTHER PUBLICATIONS

Samurai et al, "Low–Power CMS Design through $V_{th}$ Control and Low–Swing Circuits", 1997 International Symposium on Low Power Electronics and Design, Aug. 18–20, 1997, Monterey, California; Association for Computing Machinery, New York, New York.

* cited by examiner

Primary Examiner—Toan Tran
Assistant Examiner—Paul Dinh
(74) Attorney, Agent, or Firm—Kenyon & Kenyon

(57) ABSTRACT

In an automated method of sizing data transistors for a symmetrical differential sense amplifier that includes a pair of input terminals, a pair of output terminals, a pair of data transistors each having a gate coupled to a respective input terminal, and a pair of loading transistors each coupled to a respective output terminal and to a respective data transistor and having a gate coupled to the other output terminal: expected manufacturing variations of circuit parameters are determined based upon an initial size of the data transistors, an offset potential is calculated therefrom that will cause the sense amplifier to evaluate and, if the calculated offset potential exceeds an expected threshold potential for the sense amplifier, the data transistors are resized, expected manufacturing variations of circuit parameters are determined based on the resized data transistors and the calculating step is repeated.

21 Claims, 2 Drawing Sheets

1000

ROBUST LOW VOLTAGE SWING SENSE AMPLIFIER

BACKGROUND OF THE INVENTION

The present invention relates to low voltage swing sense amplifiers and method for making the same in the presence of expected manufacturing errors inherent in the manufacturing of the sense amplifiers as integrated circuits.

Low voltage swing sense amplifiers are known. Typically, they generate valid output data signals in the presence of a relatively small potential difference between two input data signals. Whereas "full rail circuits" do not generate data outputs until an input data signal undergoes a large voltage swing (typically >1 volt), the low voltage swing sense amplifier can generate valid outputs in the presence of a potential difference of only a few hundred millivolts. This difference in operation can cause a low voltage swing sense amplifier to operate at a much higher frequency than the full rail circuit.

Often, when designing a logic circuit for use in integrated circuits, a circuit designer must account for manufacturing errors that necessarily will be introduced when the circuit is fabricated. Typically, the design process requires an iterative circuit simulation process in which the designer is advised of statistical manufacturing variations that likely will occur for selected components. The circuit designer then runs repeated circuit simulations to determine whether the logic circuit will operate as intended if the expected manufacturing variations occur. Results of the circuit simulations may require that circuit components be resized. The circuit simulations typically are concluded when a logic circuit design is obtained that operates correctly in view of the expected manufacturing variations.

Low voltage swing sense amplifiers are subject to stringent manufacturing tolerances that may not be important other circuit architectures, such as full rail circuits. As explained below, strict sizing relationships must be maintained between various components of a low voltage swing sense amplifier. The iterative circuit simulation process described above can be expected to be particularly tedious because of the strict manufacturing tolerances required for the circuit.

There is a need in the art for a low voltage swing sense amplifier having a robust design that is less susceptible to manufacturing errors that can be expected during fabrication. Further there is a need in the art for a method of selecting components of a low voltage swing sense amplifier that avoids the tedious circuit simulation process that is typical of logic circuits.

SUMMARY

Embodiments of the present invention provide, an automated method of sizing data transistors in a symmetrical sense amplifier, the sense amplifier comprising a pair of input terminals, a pair of output terminals, a pair of data transistors each having a gate coupled to a respective input terminal, and a pair of loading transistors each coupled to a respective output terminal and to a respective data transistor and having a gate coupled to the other output terminal, in which: expected manufacturing variations of circuit parameters are determined based upon an initial size of the data transistors, an offset potential is calculated therefrom that will cause the sense amplifier to evaluate and, if the calculated offset potential exceeds an expected threshold potential for the sense amplifier, the data transistors are resized, expected manufacturing variations of circuit parameters are determined based on the resized data transistors and the calculating step is repeated.

DETAILED DESCRIPTION

Figure 1:
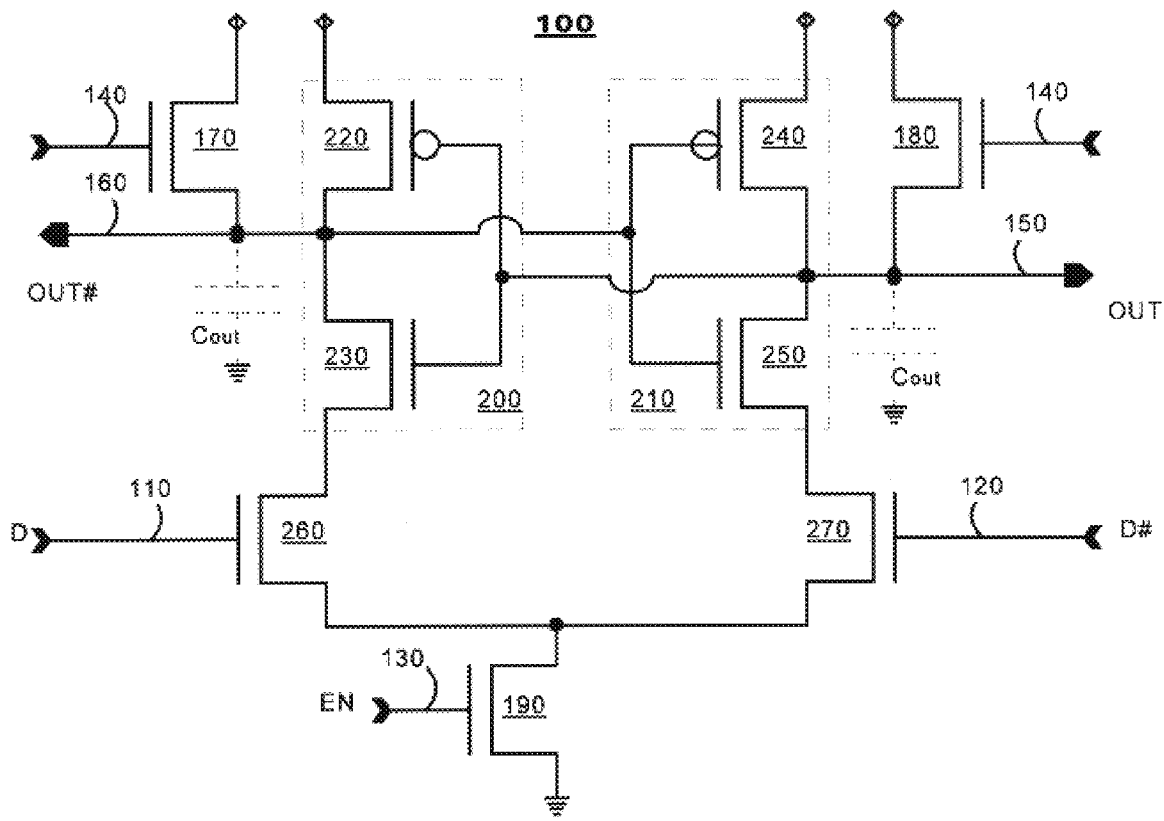
FIG. 1 is a circuit diagram of a low voltage swing logic sense amplifier according to an embodiment of the present invention.

FIG. 1 illustrates a sense amplifier 100 constructed according to an embodiment of the present invention. The sense amplifier 100 may be populated by a plurality of input terminals 110, 120 for input of input data signals D and D# respectively. The sense amplifier 100 also may include additional input terminals 130, 140 for the application of respective enabling and clocking signals. Further, the sense amplifier 100 may include output terminals 150, 160 for the output of differential output signals OUT and OUT#.

The embodiment of the sense amplifier 100 may include a pair of precharge transistors 170–180, each of which couples a respective output terminal 150, 160 to a precharge potential. In the exemplary embodiment illustrated in FIG. 1, the precharge transistors 170–180 are shown coupled to $V_{CC}$. Gates of the precharge transistors 170–180 are coupled to the input terminal 150 for the clock signal. The sense amplifier 100 may include an enabling transistor 190 coupled to an evaluation potential, shown as ground in the example of FIG. 1.

The sense amplifier 100 also may be provided with a pair of clamping circuits 200, 210, one provided in association with each of the output terminals 150, 160. A first clamping circuit 200 may include a pair of transistors 220, 230 each coupled to the output terminal 160 for the OUT signal. A first transistor 220 bridges the output terminal 160 to the precharge potential (e.g. $V_{CC}$). A second transistor 230 couples the output terminal 160 to an evaluation transistor described below. Gates of the first and second transistors 220, 230 are connected to the output terminal 150 associated with the OUT signal.

The second clamping circuit 210 also may include a pair of transistors 240, 250 each coupled to the output terminal 150 associated with the OUT signal. The first transistor 240 bridges the output terminal 150 to the precharge potential. The second transistor 250 couples the output terminal 150 to a second data transistor described below. Gates of the first and second transistors 240, 250 are connected to the output terminal 160 associated with the OUT# signal. Herein, the second transistors 230, 250 of each clamping circuit also may be called "loading transistors."

According to an embodiment of the present invention, the sense amplifier 100 may include first and second data transistors 260 and 270. A first data transistor couples the transistor 230 of first clamping circuit 200 to the enabling transistor 190 across a source-to-drain path. A gate of the first data transistor 260 may be coupled to the input terminal 110 associated with data signal D. A second data transistor 270 couples the transistor 250 of the second clamping circuit 210 to the enabling transistor 190 across a source-to-drain path. A gate of the second data transistor 270 may be coupled to the input terminal 120 associated with data signal D#.

Embodiments of the sense amplifier 100 may find application in a domino system in which the data signals D and D# transition through a precharge phase and an evaluation phase on each clock cycle. During a precharge phase, each signal is maintained at a precharge potential (such as $V_{CC}$). Neither signal D or D# carries information during the precharge phase. During an evaluation phase, one of the data signals D or D# may transition from the precharge potential toward the evaluation potential; the other signal remains at the precharge potential. In an LVS circuit employing domino techniques, the signal typically would make a partial transition toward the evaluation potential, not a complete transition as would occur in full rail circuits.

The embodiment of FIG. 1 as illustrated is a "precharge high, evaluate low" circuit; the precharge potential is at $V_{CC}$ and the evaluation potential is ground. The data transistors 260, 270 the loading transistors 230,250 and the precharge transistors 170,180 may be selected to be of a type that is conductive in response to the precharge potential. For example, in the "precharge high" embodiment of FIG. 1, the transistors 1 70, 180, 230, 250, 260 and 270 may be NMOS transistors. Additionally, the first clamping transistors 220, 240 of each clamping circuit 220, 210 may be selected to be of a type that is conductive in response to the evaluation potential. For example, in the "evaluate low" embodiment of FIG. 1 the transistors 220, 240 may be PMOS transistors.

In an ideal manufacturing environment, all counterpart transistors of the sense amplifier 100 would be balanced identically. That is, the two data transistors 260 and 270 each would possess the same widths and channels lengths. The first clamping transistors 220, 240 of the two clamping circuits 200, 210 also would possess the same widths and channels lengths. Further, the loading transistors 230, 250 of the two clamping circuits 200,210 would possess the same widths and channels lengths. Of course, experience with integrated circuits teaches that perfect balancing cannot be maintained during fabrication.

Consider operation of an ideal sense amplifier 100, one that is balanced perfectly. During the precharge phase, the enable signal is low rendering the enable transistor 190 nonconductive. The clock signal is high, rendering the clocking transistors 170, 180 conductive. Further, the data signals D and D# are precharged high, rendering transistors 260, 270 conductive. Because the output terminals 150, 160 are precharged, the loading transistors 230,250 of the two clamping circuits 200, 210 are conductive. Thus, intermediate nodes $N_1$ and $N_2$ are precharged to $V_{CC}$. Further, because the data transistors 260, 270 all are conductive, node $N_3$, the source of the enable transistor 190, also is precharged.

During the evaluation phase, the enable transistor 190 becomes conductive and node $N_3$ discharges to ground. The clocking transistors 170 and 180 become non-conductive, allowing the potentials at the output terminals 150, 160 to float at the precharge potential. Both data transistors 260, 270 initially are strongly conductive, discharging the two output terminals 150, 160. One of the data signals (say, D#) begins to evaluate rendering its associated data transistor (e.g. 270) increasingly less conductive; the other data signal D remains at the precharge potential and its associated data transistor 260 remains strongly conductive. Thus, one of the output terminals 160 discharges at a faster rate than the other output terminal 150. In this example, output terminal 160 becomes the dominant evaluating output terminal.

The dominant evaluating output terminal 160 activates the clamping circuit 210 of the other output terminal 150. The first transistor 240 of the clamping circuit 210 becomes conductive causing the output terminal 150 to return to the precharge potential. Also, the second transistor 250 of the clamping circuit 210 becomes non-conductive further disrupting the discharge path from the output terminal 150 through the data transistor 270 and the enabling transistor 190 to the evaluation potential. Thus, the OUT# output terminal 160 evaluates but the OUT output terminal 1 50 does not.

When manufactured as an integrated circuit, however, the transistors of the sense amplifier 100 may not be perfectly balanced. If a sense amplifier 100 were manufactured where the second data transistor 270 was sized more strongly than the first data transistor 260, it may affect the operation of the sense amplifier 100. Consider the example shown above where D# evaluates.

During the evaluation phase, the enable transistor 190 becomes conductive and node N3 discharges to ground. The clocking transistors 170 and 180 become non-conductive, allowing the potentials at the output terminals 150, 160 to float at the precharge potential. Both data transistors 260, 270 initially are strongly conductive, discharging the two output terminals 150, 160. The data signal D# begins to evaluate rendering data transistor 270 increasingly less conductive. However, because the data transistor 270 possesses a higher size than the data transistor 260 associated with data signal D, the output terminal 150 may discharge at a faster rate than output terminal 160. In this case, output terminal 150 would become the dominant evaluating output terminal.

The dominant evaluating output terminal 150 would activate the clamping circuit 200 of the other output terminal 160. The first transistor 220 of the clamping circuit 200 becomes conductive, causing the output terminal 160 to return to the precharge potential. Also, the second transistor 230 of the clamping circuit 200 becomes non-conductive further disrupting the discharge path from the output terminal 160 through the data transistor 260 and the enabling transistor 190 to the evaluation potential. In this example, the OUT output terminal 150 evaluates but the OUT# output terminal 160 does not. Thus, a manufacturing error can cause a sense amplifier 100 to evaluate incorrectly.

According to an embodiment of the present invention, the data transistors 260, 270 and the loading transistors 230, 250 may be sized according to a predetermined method to achieve an operable sense amplifier 100 even in the presence of sizing errors that may be introduced during manufacture. As is known, a transistor may be characterized by its width W and channel length L. The sizes of the data transistors 260, 270 and the loading transistors 230, 250 are shown in FIG. 1 as $S_1$, $S_2$, $S_3$, and $S_4$ respectively. As described, under ideal conditions $S_1 = S_2$ and $S_3 = S_4$.

Equation 1 below describes the potential difference between the data signals D and D# labeled $V_{offset}$ that can cause the sense amplifier 100 to evaluate at one of the output terminals 150, 160:

$$V_{offset}^2 = \Delta V_{t_{1,2}}^2 + a^2 \Delta S_{1,2}^2 + b^2 \Delta V_{t_{3,4}}^2 + c^2 \Delta C_{out}^2 \tag{1}$$

The coefficient a represents offset voltage contributions that may be induced by normalized geometry mismatches among the data transistors 260, 270. Typically, coefficient a is proportional to the transconductance of the input devices, and is inversely proportional to the effective transistor size S.

The coefficient b represents offset voltage contributions that may be induced by threshold mismatches among the loading transistors 230, 250. Typically, the coefficient b is proportional to the effective transistor sizes of the two loading transistors 230, 250 and inversely proportional to the effective size of the data transistors 260, 270.

The coefficient c describes offset voltage contributions that may be induced by normalized mismatch at the output loading of the sense amplifier. Typically, coefficient c is proportional to the transconductance of the data transistors 260, 270 and inversely proportional to the effective size of the data transistors 260, 270 and the total loading of the sense amplifier 100.

According to an embodiment of the present invention, the coefficients a, b and c are determined according to the following relations:

$$a = g_{m_{1,2}} \left(\frac{1}{\mu C_{ox}}\right)\left(\frac{1}{S_{1,2}^3}\right)$$

$$b = 0.5 \left(\frac{1}{S_{1,2}}\right) S_{3,4} \left(\frac{(V_{gs} - V_t)_{3,4}}{(V_{ds})_{1,2}}\right)$$

$$c = g_{m_{1,2}} \left(\frac{1}{\mu C_{ox}}\right) Q \left(\frac{1}{S_{1,2}}\right) \frac{1}{C_{out}}$$

where:

$g_m$ represents the transconductance of the data transistors 260, 270;

$\mu_n$ represents electron mobility;

$C_{ox}$ represents the oxide capacitance of the sense amplifier 100;

$C_{out}$ represents the capacitance of the output terminals 150, 160;

$V_{ds1,2}$ represents the drain bias at the data transistors 260, 270;

$V_{gs}$ represents the gate bias at the loading transistors 230, 250; and $V_{t3,4}$ represents an activation potential of the loading transistors 230, 250.

Further, the values $\Delta V_{t1,2}^2$, $\Delta S_{1,2}^2$, $\Delta V2_{3,4}^2$ and $\Delta C_{out}^2$ represent manufacturing variances that are known for the fabrication process that will be used to manufacture the sense amplifier 100 as an integrated circuit.

Figure 2:
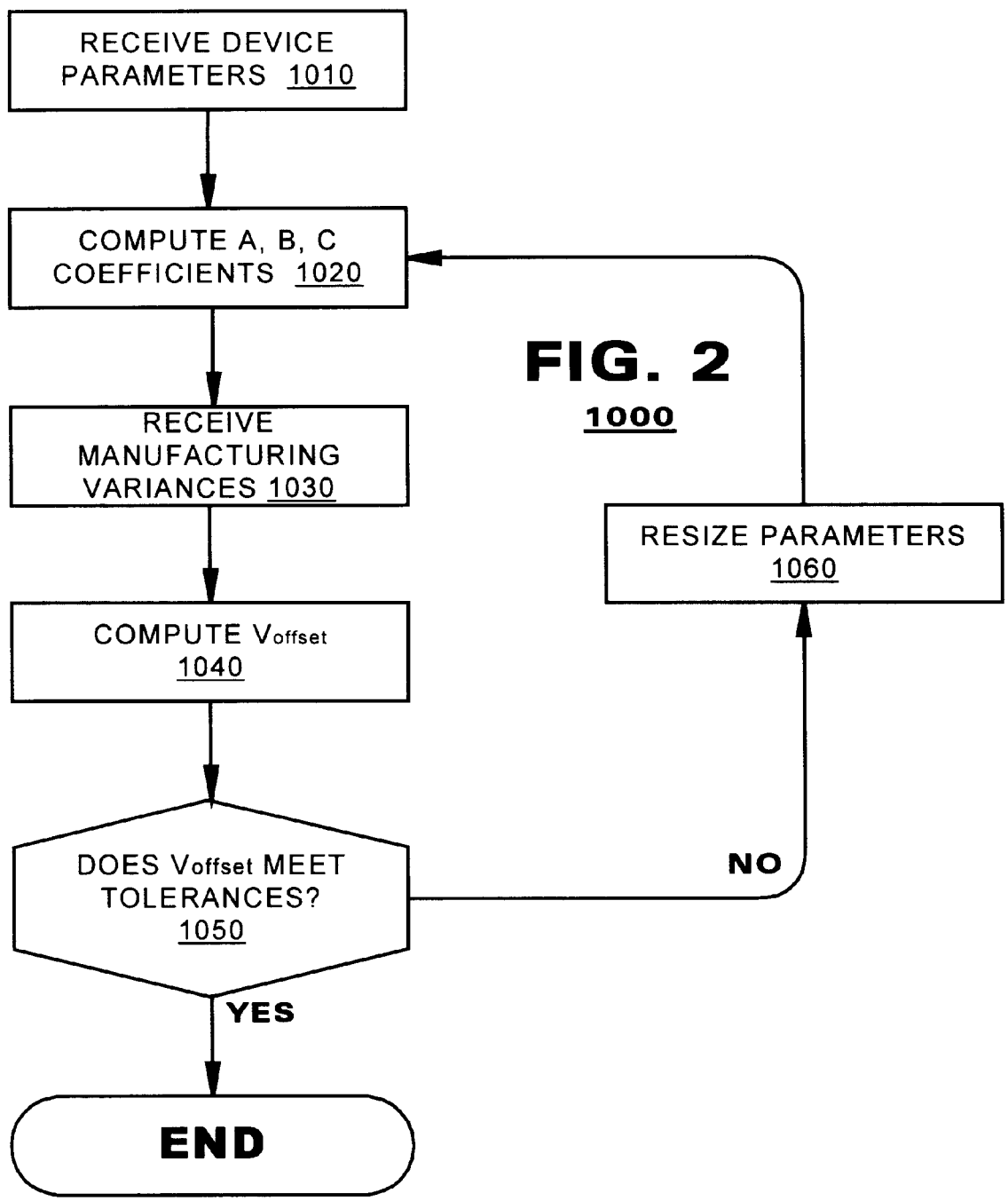
FIG. 2 is a flow diagram of a method according to an embodiment of the present invention.

According to an embodiment of the present invention, an iterative method may be used to calculate widths W and channel lengths L of the transistors 230, 250, 260, 270 to introduce manufacturing tolerances into the design of the sense amplifier 100. An embodiment of the method 1000 is shown in FIG. 2. The method is initialized with device parameters obtained from the circuit design (Step 1010). Thus, the $g_m$, $\mu_n$, $C_{ox}$ and S values of the circuit are determined initially from the circuit design. Based upon these values, the coefficients a, b and c may be calculated (Step 1020). Also based on the values, the manufacturing variances $\Delta V_{t1,2}^2$, $\Delta S_{1,2}^2$, $V_{3,4}^2$ and $\Delta C_{out}^2$ are determined (Step 1030). At the conclusion of Steps 1010 and 1020, the $V_{offset}$ value is determined (Step 1040). If the computed $V_{offset}$ exceeds a desired $V_{thresh}$, the design parameters used for the sense amplifier are sufficient (Step 1050). If not, the widths and channel lengths are adjusted so as to bring the $V_{offset}$ closer to the desired $V_{thresh}$ (Step 1060). In this latter case, the method returns to Step 1020 for recomputation of parameters a, b and c.

The iterative method 1000 may be executed on a computer. It provides for faster design of a sense amplifier than would be derived using the more traditional circuit-simulation approach described above.

Figure 3:
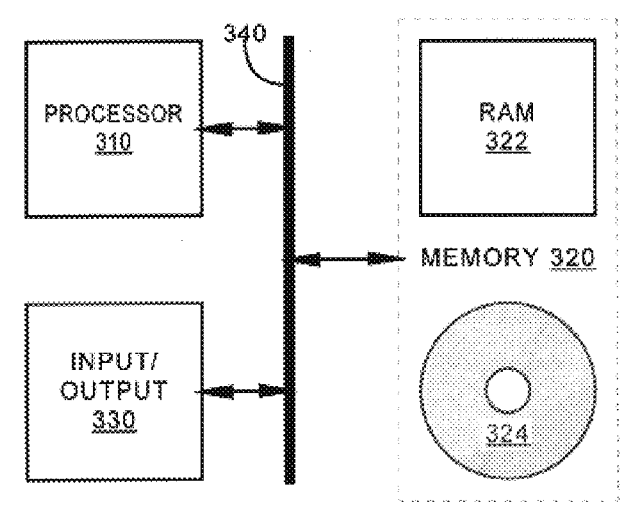
FIG. 3 is a block diagram of a computer for use with methods of the present invention.

FIG. 3 is a block diagram illustrating the basic elements of a computer 300 on which the method 1000 may be executed in accordance with an embodiment of the present invention. The computer 300 includes a processor 310, memory 320 and input/output devices 330. The processor 310 executes program instructions that may be stored in memory 320. The memory 320 may be populated by various memories that are known for use with computer systems, such as RAMs 322, ROMs, or eletrical, magnetic or optical memory devices 324.

A sense amplifier 100 that includes transistors having sizes defined according to the method 1000 possesses a more robust design than has otherwise been achieved. The effect of the design introduces latency into the discharge time of the output terminals 150, 160 (FIG. 1). This latency is considered desirable because it provides enhanced reliability of sense amplifiers 100 when they are manufactured as integrated circuits. Thus, for a manufactured batch of integrated circuits including the sense amplifier 100, the present invention is likely to improve the yield of the batch.

Several embodiments of the present invention are specifically illustrated and described herein. However, it will be appreciated that modifications and variations of the present invention are covered by the above teachings and within the purview of the appended claims without departing from the spirit and intended scope of the invention.

What is claimed is:

1. A symmetrical sense amplifier, comprising:

a pair of input terminals, a pair of output terminals, a pair of data transistors, each having a gate coupled to a respective input terminal, a pair of loading transistors, each coupled to a respective output terminal and to a respective data transistor and having a gate coupled to the other output terminal, wherein sizes of the data transistors satisfy the relation:

$$V_{thresh}^2 \leq \Delta V_{t1,2}^2 + a^2 \Delta S_{1,2}^2 + b^2 \Delta V_{t3,4}^2 + c^2 \Delta C_{out}^2$$

in which $S_{1,2}$ represents size of the data transistors, $\Delta V_{t1,2}^2$ represents expected variations of the activation potential of the data transistors, a represents expected geometry mismatches among the data transistors, b represents expected threshold mismatches among the loading transistors, c represents expected loading mismatches at the output terminals, and $\Delta C_{out}^2$ represents expected capacitance mismatches at the output terminals.

2. The method of claim 1, wherein the coefficient a is determined by:

$$a = g_{m_{1,2}} \left(\frac{1}{\mu C_{ox}}\right)\left(\frac{1}{S_{1,2}^3}\right)$$

wherein $g_m$ represents transconductance of the data transistors, $\mu$ represents electron mobility, and $C_{ox}$ represents oxide capacitance of the sense amplifier.

3. The method of claim 1, wherein the coefficient b is determined by:

$$b = 0.5\left(\frac{1}{S_{1,2}}\right)S_{3,4}\left(\frac{(V_{gs} - V_t)_{3,4}}{(V_{ds})_{1,2}}\right)$$

wherein $S_{3,4}$ represents size of the loading transistors, $V_{ds1,2}$ represents drain bias at the data transistors, $V_{gs}$ represents a gate bias at the loading transistors, and $V_{t3,4}$ represents activation potential of the loading transistors.

4. The method of claim 1, wherein the coefficient c is determined by:

$$c = g_{m_{1,2}}\left(\frac{1}{\mu C_{ox}}\right)\left(\frac{1}{S_{1,2}}\right)\frac{1}{C_{out}}$$

wherein $g_m$ represents the transconductance of the data transistors, $\mu$ represents electron mobility, $C_{ox}$ represents oxide capacitance of the sense amplifier, and $C_{out}$ represents loading capacitance of the sense amplifier.

5. The method of claim 1, wherein the size of the data transistors is determined by a channel width and a channel length of the data transistors.

6. An automated method of sizing data transistors in a symmetrical sense amplifier, the method comprising:

determining expected manufacturing variations of circuit parameters based upon an initial size of the data transistors, based upon the expected manufacturing variations, calculating an offset potential that will cause the sense amplifier to evaluate, if the calculated offset potential exceeds an expected threshold potential for the sense amplifier:
resizing the data transistors,
determining expected manufacturing variations of circuit parameters based on
the resized data transistors and
repeating the calculating step.

7. The method of claim 6, wherein the sense amplifier comprises a pair of input terminals, a pair of output terminals, a pair of data transistors each having a gate coupled to a respective input terminal, and a pair of loading transistors each coupled to a respective output terminal and to a respective data transistor and having a gate coupled to the other output terminal, and the offset potential is calculated according to:

$$V_{offset}^2 = \Delta V_{t1,2}^2 + a^2 \Delta S_{1,2}^2 + b^2 \Delta V_{t3,4}^2 + c^2 \Delta C_{out}^2$$

in which $S_{1,2}$ represents the size of the data transistors, $\Delta V^2_{t1,2}$ represents expected variation of the activation potential of the data transistors, a represents expected geometry mismatches among the data transistors, b represents expected threshold mismatches among the loading transistors, c represents expected loading mismatch at the output terminals, and $\Delta C^2_{out}$ represents expected capacitance mismatch at the output terminals.

8. The method of claim 7, wherein the coefficient a is determined by:

$$a = g_{m_{1,2}}\left(\frac{1}{\mu C_{ox}}\right)\left(\frac{1}{S_{1,2}^3}\right)$$

wherein $g_m$ represents transconductance of the data transistors, $\mu$ represents electron mobility, and $C_{ox}$ represents the oxide capacitance of the sense amplifier.

9. The method of claim 7, wherein the coefficient b is determined by:

$$b = 0.5\left(\frac{1}{S_{1,2}}\right)S_{3,4}\left(\frac{(V_{gs} - V_t)_{3,4}}{(V_{ds})_{1,2}}\right)$$

wherein $S_{3,4}$ represents the size of the loading transistors, $V_{ds1,2}$ represents drain bias at the data transistors, $V_{gs}$ represents gate bias at the loading transistors, and $V_{t3,4}$ represents an activation potential of the loading transistors.

10. The method of claim 7, wherein the coefficient c is determined by:

$$c = g_{m_{1,2}}\left(\frac{1}{\mu C_{ox}}\right)\left(\frac{1}{S_{1,2}}\right)\frac{1}{C_{out}}$$

wherein $g_m$ represents the transconductance of the data transistors, $\mu$ represents electron mobility, $C_{ox}$ represents the oxide capacitance of the sense amplifier, and $C_{out}$ represents loading capacitance of the sense amplifier.

11. The method of claim 7, wherein the size of the data transistors is determined by a channel width and a channel length of the data transistors.

12. A symmetrical sense amplifier, comprising:

a pair of data transistors, each having an input terminal for a respective differential input signal, a pair of output terminals, a pair of clamping circuits, each coupled to a respective output terminal and having an input for the other output terminal, wherein each clamping circuit includes a loading transistor coupled to a respective data transistor in such a way to provide a selectively enable evaluation charging path, wherein sizes of the data transistors satisfy the relation:

$$V_{thresh}^2 \leq \Delta V_{t1,2}^2 + a^2 \Delta S_{1,2}^2 + b^2 \Delta V_{t3,4}^2 + c^2 \Delta C_{out}^2$$

in which $S_{1,2}$ represents the size of the data transistors, $\Delta V^2_{t1,2}$ represents expected variation of the activation potential of the data transistors, a represents expected geometry mismatches among the data transistors, b represents expected threshold mismatches among the loading transistors, c represents expected loading mismatch at the output terminals, and $\Delta C^2_{out}$ represents expected capacitance mismatches at the output terminals.

13. The method of claim 12, wherein the coefficient a is determined by:

$$a = g_{m_{1,2}}\left(\frac{1}{\mu C_{ox}}\right)\left(\frac{1}{S_{1,2}^3}\right)$$

wherein
- $g_m$ represents the transconductance of the data transistors,
- p represents the electron mobility, and
- $C_{ox}$ represents the oxide capacitance of the sense amplifier.

14. The method of claim 12, wherein the coefficient b is determined by:

$$b = 0.5\left(\frac{1}{S_{1,2}}\right)S_{3,4}\left(\frac{(V_{gs} - V_t)_{3,4}}{(V_{ds})_{1,2}}\right)$$

wherein
- $S_{3,4}$ represents the size of the loading transistors,
- $V_{ds1,2}$ represents drain bias at the data transistors,
- $V_{gs}$ represents a gate bias at the loading transistors, and
- $V_{t3,4}$ represents the activation potential of the loading transistors.

15. The method of claim 12, wherein the coefficient c is determined by:

$$c = g_{m_{1,2}}\left(\frac{1}{\mu C_{ox}}\right)\left(\frac{1}{S_{1,2}}\right)\frac{1}{C_{out}}$$

wherein
- $g_m$ represents the transconductance of the data transistors,
- $\mu$ represents electron mobility,
- $C_{ox}$ represents oxide capacitance of the sense amplifier, and
- $C_{out}$ represents loading capacitance of the sense amplifier.

16. The method of claim 12, wherein the size of the data transistors is determined by a channel width and a channel length of the data transistors.

17. A computer readable medium having stored thereon program instructions that, when executed by a processor, cause the processor to size data transistors for a symmetrical sense amplifier according to the method of:
- determining expected manufacturing variations of circuit parameters based upon an initial size of the data transistors,
- based upon the expected manufacturing variations, calculating an offset potential that will cause the sense amplifier to evaluate,
- if the calculated offset potential exceeds an expected threshold potential for the sense amplifier:
  - resizing the data transistors,
  - determining expected manufacturing variations of circuit parameters based on the resized data transistors and
  - repeating the calculating step.

18. The method of claim 17, wherein the sense amplifier comprising a pair of input terminals, a pair of output terminals, a pair of data transistors each having a gate coupled to a respective input terminal, and a pair of loading transistors each coupled to a respective output terminal and to a respective data transistor and having a gate coupled to the other output terminal, and
the offset potential is calculated according to:

$$V_{offset}^2 = aV_{t_{1,2}}^2 + a^2\Delta S_{1,2}^2 + b^2\Delta V_{t_{3,4}}^2 + c^2\Delta C_{out}^2$$

in which
- $S_{1,2}$ represents the size of the data transistors,
- $\Delta V^2_{t1,2}$ represents expected variation of the activation potential of the data transistors,
- a represents expected geometry mismatches among the data transistors,
- b represents expected threshold mismatches among the loading transistors,
- c represents expected loading mismatch at the output terminals, and
- $\Delta C^2_{out}$ represents expected capacitance mismatch at the output terminals.

19. The method of claim 18, wherein the coefficient a is determined by:

$$a = g_{m_{1,2}}\left(\frac{1}{\mu C_{ox}}\right)\left(\frac{1}{S_{1,2}^3}\right)$$

wherein
- $g_m$ represents transconductance of the data transistors,
- $\mu$ represents electron mobility, and
- $C_{ox}$ represents the oxide capacitance of the sense amplifier.

20. The method of claim 18, wherein the coefficient b is determined by:

$$b = 0.5\left(\frac{1}{S_{1,2}}\right)S_{3,4}\left(\frac{(V_{gs} - V_t)_{3,4}}{(V_{ds})_{1,2}}\right)$$

wherein
- $S_{3,4}$ represents the size of the loading transistors,
- $V_{ds1,2}$ represents drain bias at the data transistors,
- $V_{gs}$ represents gate bias at the loading transistors, and
- $V_{t3,4}$ represents an activation potential of the loading transistors.

21. The method of claim 18, wherein the coefficient c is determined by:

$$c = g_{m_{1,2}}\left(\frac{1}{\mu C_{ox}}\right)\left(\frac{1}{S_{1,2}}\right)\frac{1}{C_{out}}$$

wherein
- $g_m$ represents the transconductance of the data transistors,
- $\mu$ represents electron mobility,
- $C_{ox}$ represents the oxide capacitance of the sense amplifier, and
- $C_{out}$ represents loading capacitance of the sense amplifier.

* * * * *